US 6,580,797 B1

(12) United States Patent
Papadopoulos et al.

(10) Patent No.: US 6,580,797 B1
(45) Date of Patent: *Jun. 17, 2003

(54) AMPLIFIER CIRCUIT FOR ELECTRET MICROPHONE WITH ENHANCED PERFORMANCE

(75) Inventors: Costas Papadopoulos, Acton, MA (US); David J. Truesdell, Acton, MA (US)

(73) Assignee: VXI Corporation, Rollinsford, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/335,789

(22) Filed: Jun. 18, 1999

Related U.S. Application Data

(63) Continuation-in-part of application No. 09/115,980, filed on Jul. 15, 1998.

(51) Int. Cl.[7] .............................................. H04R 3/00
(52) U.S. Cl. ..................... 381/111; 113/120; 113/122
(58) Field of Search ................................ 381/113, 123, 381/122, 91, 111, 120

(56) References Cited

U.S. PATENT DOCUMENTS

| 4,160,881 | A |   | 7/1979  | Smulders ................ 381/191 |
| 4,331,840 | A |   | 5/1982  | Murphy et al. ........... 381/191 |
| 4,414,433 | A | * | 11/1983 | Horie et al. ............. 381/113 |
| 4,418,246 | A |   | 11/1983 | Sawyer .................. 381/191 |
| 4,629,910 | A | * | 12/1986 | Early et al. ............. 381/113 |
| 4,731,830 | A | * | 3/1988  | Thompson ............... 379/387 |
| 4,764,690 | A |   | 8/1988  | Murphy et al. ........... 381/191 |
| 5,121,075 | A | * | 6/1992  | Roach ................... 330/126 |
| 5,226,087 | A | * | 7/1993  | Ono et al. ............... 381/92 |
| 5,381,473 | A |   | 1/1995  | Andrea et al. ........ 379/358.13 |
| 5,459,283 | A | * | 10/1995 | Birdwell, Jr. ............. 84/737 |
| 5,459,792 | A | * | 10/1995 | Reichel et al. ........... 381/111 |
| 5,579,397 | A |   | 11/1996 | Ikeda et al. .............. 381/120 |
| 5,666,086 | A | * | 9/1997  | Klein ................... 330/253 |
| 6,137,879 | A | * | 10/2000 | Papadopoulous et al. ... 379/387 |

OTHER PUBLICATIONS

Lake, Thomas, "A Comparison of Acoustic and Electronic Noise Canceling Microphones for Speech Recognition Application," [http://www.computeraudio.telex.com/in03a.htm].

. . . "IEEE Standard Methods for Measuring Transmission Performance of Telephone Handsets and Headsets," *Transmission Systems Committee of the IEEE Communications Society*, (1994): iii–18.

* cited by examiner

Primary Examiner—Minsun Oh Harvey
Assistant Examiner—Laura A. Grier
(74) Attorney, Agent, or Firm—Samuels, Gauthier & Stevens, LLP

(57) ABSTRACT

A circuit for connecting an electret microphone to audio inputs. The circuit includes a coupling circuit for accepting DC bias voltage from the audio inputs and providing audio signal to the inputs. Frequency shaping circuitry is provided for reducing unwanted microphone sensitivity at selected frequencies. In one aspect of the invention a battery connector is provided where at least one battery may be optionally connected.

11 Claims, 5 Drawing Sheets

AMPLIFIER CIRCUIT FOR ELECTRET MICROPHONE WITH ENHANCED PERFORMANCE

PRIORITY DATA

This application is a continuation-in-part of Ser. No. 09/115,980 filed Jul. 15, 1998.

BACKGROUND OF THE INVENTION

The invention relates to amplifier and coupling circuitry for electret microphones.

Electret microphones are commonly used in headsets for telephony, computer telephony and speech recognition applications. Such electrets have virtually displaced the larger, heavier dynamic microphones. Dynamic mics generate a very small signal voltage when excited by voice. The electret mic provides higher output by virtue of active circuitry (most commonly a JFET), but requires a DC bias voltage source that may be part of the telephone or computer.

Low cost electret mics may suffice for telephony because of the limited telephone link bandwidth, the wide dynamic range of the human ear and the ability of the brain to compensate for noise and distortion. Expensive, high performance electrets are preferred in voice enabled applications with personal computers such as voice command and speech recognition because they contribute to greater accuracy. The microphone or headset is connected to a sound card and in almost every instance today, the PC provides DC bias at the mic receptacle, which is the familiar 3.5 mm stereo jack also found on other consumer electronic products. It is desirable to provide the greater recognition accuracy of high performance electrets using low cost mic elements by augmenting with circuitry and electroacoustic techniques.

Methods to enhance the performance of ordinary, low cost electrets using batteries and circuitry are disclosed in co-pending U.S. patent application Ser. No. 08/968,307 and U.S. patent application Ser. No. 08/967,930 of common assignee. Battery based consumer products, however, have drawbacks, more so when the batteries are not included in the package. Although as stated, the PC sound card provides DC mic bias via the microphone input connector, there is no standard with respect to voltage level or pinout at this stereo jack. Although there is only one connector for one microphone, "3.5 mm stereo" in this instance describes a jack to accept a plug with three terminals: tip, ring and sleeve. Sleeve is always the common or ground terminal, but tip and ring may be wired in one of several ways for DC bias and signal. In addition, the low voltage bias source may be severely current limited by high resistance internal to the sound card, making the design of external, active circuits to enhance mic performance very difficult. In fact, even without additional circuitry, mic operation may be compromised by the limited current from the computer.

SUMMARY OF THE INVENTION

In one embodiment of the invention there is provided a circuit for connecting an electret microphone to audio inputs. The circuit includes a coupling circuit for accepting DC bias voltage from the audio inputs and providing audio signal to the inputs. Frequency shaping circuitry is provided for reducing unwanted microphone sensitivity at selected frequencies. In one aspect of the invention a battery connector is provided where at least one battery may be optionally connected.

In each embodiment of the invention, the circuit output impedance can be made lower to minimize electret mic attenuation caused by an output node preferential to dynamic microphones. Each aforementioned and one further, simpler embodiment will operate without regard to the wiring configuration of the audio output node, with no additional hardware and requiring no special installation steps by the user.

DETAILED DESCRIPTION OF THE ILLUSTRATED EMBODIMENTS

Figure 1:
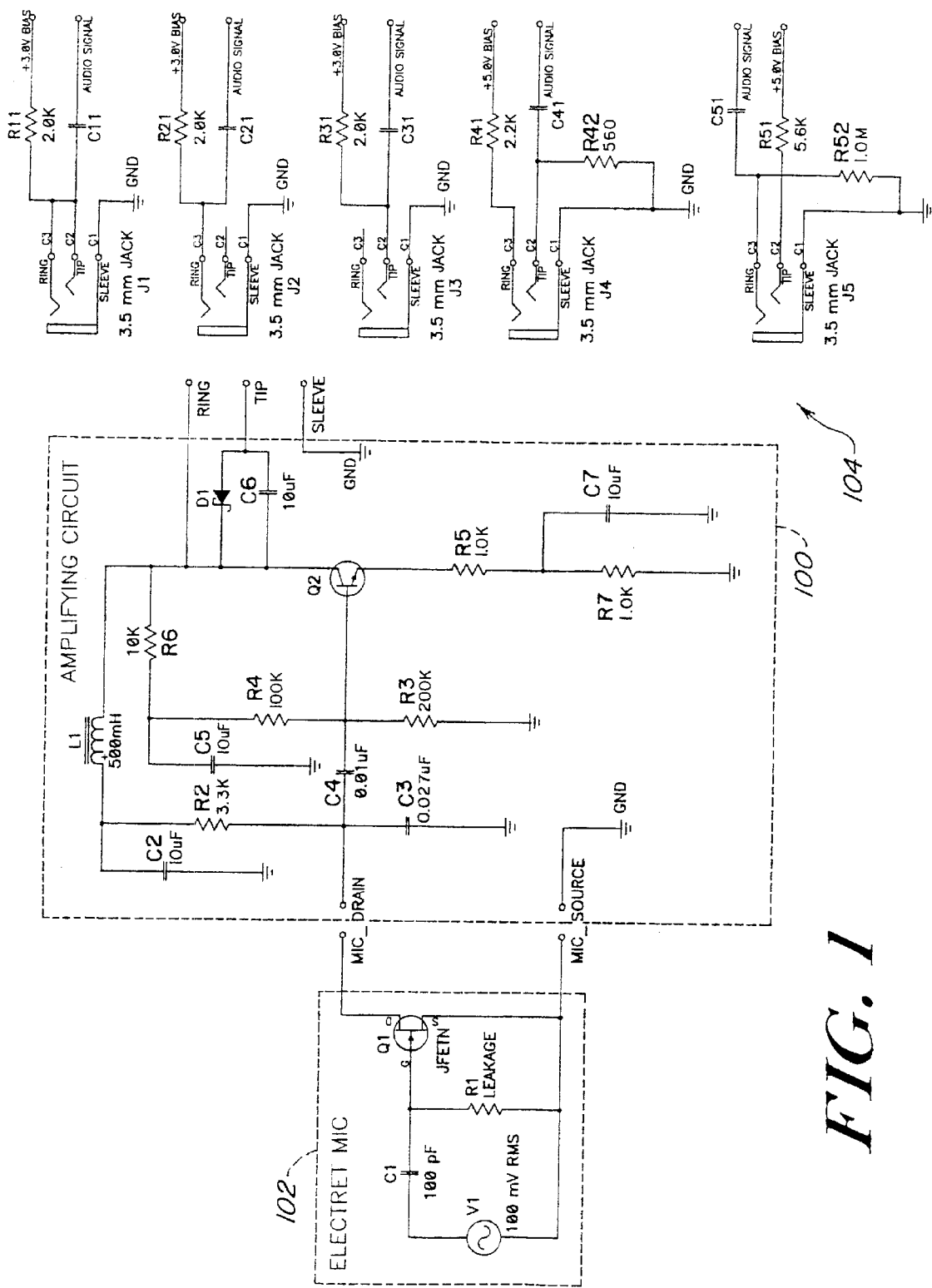
FIG. 1 is a schematic circuit diagram of an exemplary arrangement of an amplifier circuit, an electret mic and associated output jack connections in accordance with the invention.

FIG. 1 is a schematic circuit diagram of an exemplary arrangement of an amplifier circuit 100, an electret mic 102 and associated output jack connections 104 in accordance with the invention. The electret mic 102 can be a typical low cost electret such as Primo EM 124. The combination of V1 (100 mV RMS) and C1 (100 pF) represent the charged electret diaphragm moving under the influence of moderately loud speech, thus coupling an audio signal to Q1 JFET gate. There is no discrete component R1 inside the mic housing, only a very high leakage resistance between the gate and source of Q1. If this leakage is estimated as 100 MΩ, then the high pass corner frequency of R1C1 is approximately 16 Hz. Human speech covers the range of 200 Hz to over 2 kHz and voice recognition applications demand a flat response between 300 Hz and 2 kHz. This Q1 electrical model does not convey all of the electroacoustic parameters, however, common electrets have a flat or rising frequency response up to at least 10 kHz.

The output jack connections can include several typical PC sound card mic input circuits as shown as J1 to J5 in FIG. 1. Each jack connection includes a ring, tip and sleeve port. The sleeve is coupled to ground. In jack J1, the tip is coupled to both a resistor R11 and a capacitor C11 configured in parallel. R11 is coupled to a +3V bias, and C11 is coupled to an audio signal port. Jack J2 has a parallel connected resistor R21 (coupled to +3V bias) and a capacitor C21 (coupled to an audio signal port) connected to the ring port. Jack J3 has a parallel connected resistor R31 (coupled to +3V bias) and a capacitor C31 (coupled to an audio signal port) connected to the tip port. In jack J4, the ring port is connected to a resistor R41, which in turn is connected to a +5V bias. The tip port is connected to a parallel connected capacitor C41 (coupled to an audio signal port) and a resistor R42 (coupled to ground). In jack J5, the tip port is connected to a resistor R51, which in turn is connected to a +5V bias. The ring port is connected to a parallel connected capacitor C51 (coupled to an audio signal port) and a resistor R52 (coupled to ground).

A common electret mic can be connected directly to these inputs with a 3.5 mm stereo plug if both tip and ring terminals of the plug are tied to the mic drain and the sleeve terminal to the source. An exemplary headset microphone is the Andrea Electronics NC 50. The resulting performance may be poor for three reasons. First, needless low frequency sensitivity will admit undesirable wind vibrations or similar sounds such as breath pops. Second, excessive high frequency response will reduce the signal to noise ratio by admitting sounds above the voice band. Third, the limited amplitude swing will cause distortion when a person is required to speak loudly because of ambient noise, say in a factory. It will now be shown how this distortion will occur when this exemplary electret mic with typical bias current of 150 $\mu$A is connected to jack connection J1. The voltage at J1 tip and ring will be 2.7 VDC swinging approximately 100 mV RMS (141 mV peak) with normal speech. With only 300 mV of headroom before hitting the supply rail of 3.0 V, when a louder word is spoken it will be distorted by clipping at the positive peaks. This distortion will adversely affect speech recognition since the software has been "trained" by the user at a normal voice level but expects faithful mic reproduction at other loudness levels.

The amplifier circuit 100 will improve all three deficiencies of the low cost 150 $\mu$A electret mic when connected first to J1 and later to J2 through J5, by shaping of the low and high audio frequency response, and by increasing dynamic range. The circuit 100 includes an amplifier stage transistor Q2, which when biased for 350 $\mu$A operation, the ring voltage is 3.0V−(150 $\mu$A+350 $\mu$A)2.0 k$\Omega$=2.0V, and the mic drain is at 1.5V. An inductor L1 and capacitor C2 establish a very stable mic bias voltage source of 2.0V such that the maximum signal swing possible at J1 tip and ring is 2.7V determined by the mic current times the resistance R11. Therefore, maximum positive swing is 500 mV at the mic drain and 700 mV at the Q2 collector. A capacitor C3 (0.027 $\mu$F) and a resistor R2 provide an opportunity to low pass filter with a corner frequency of 1.8 kHz. Similarly, a capacitor C4 (0.01 $\mu$F) and parallel resistors R3//R4 will high pass frequencies above 240 Hz.

The mid band gain of transistor Q2 is somewhat less than R11/R5=2, and the mic "gain" is R2/R11=1.65, relative to a direct mic connection at J1. Connection to a different sound card represented by J2 is equivalent to the J1 connection. Operation with connection J3 is similar to J1, and relies on a diode D1 to conduct bias current and a capacitor C6 to carry the voice signal. There is now an option to trade off some of the overall gain of 3.3 by lowering the output impedance and thus reducing the loading effect of a connection to J4, typical of Creative Labs sound card inputs. When connected to J4, the Q2 collector impedance becomes R6//R41//R42=419$\Omega$, so approximately 13 dB of signal is lost relative to the 2.0 k$\Omega$ condition at J1. By reducing bias string resistor R6 (which is AC grounded) to a value of 1 k$\Omega$, circuit 100 output impedance is lowered such that only 6.7 dB of mic signal is lost at J4 and less mic level variation is seen among PC sound cards. Finally, a connection to another typical sound card input represented by J5 will result in a level of (R11//R6)/(R51//R6) or 2 dB above the J1 condition.

It will be appreciated that other microphones such as Andrea Electronics NC 50 may require a separate male to female "converter plug" which interposes a capacitor between tip and ring in order to improve operation with inputs represented by connection J4. This capacitor separates the resistor R41 from resistor R42 when mic plug tip and ring are connected together, and is required to prevent severe bias voltage division from 5.0V to 1.0V. The combination of capacitor C6 and diode D1 avoids the inconvenience and cost of a converter plug and enables operation with every type of sound card with a direct connection.

Figure 2:
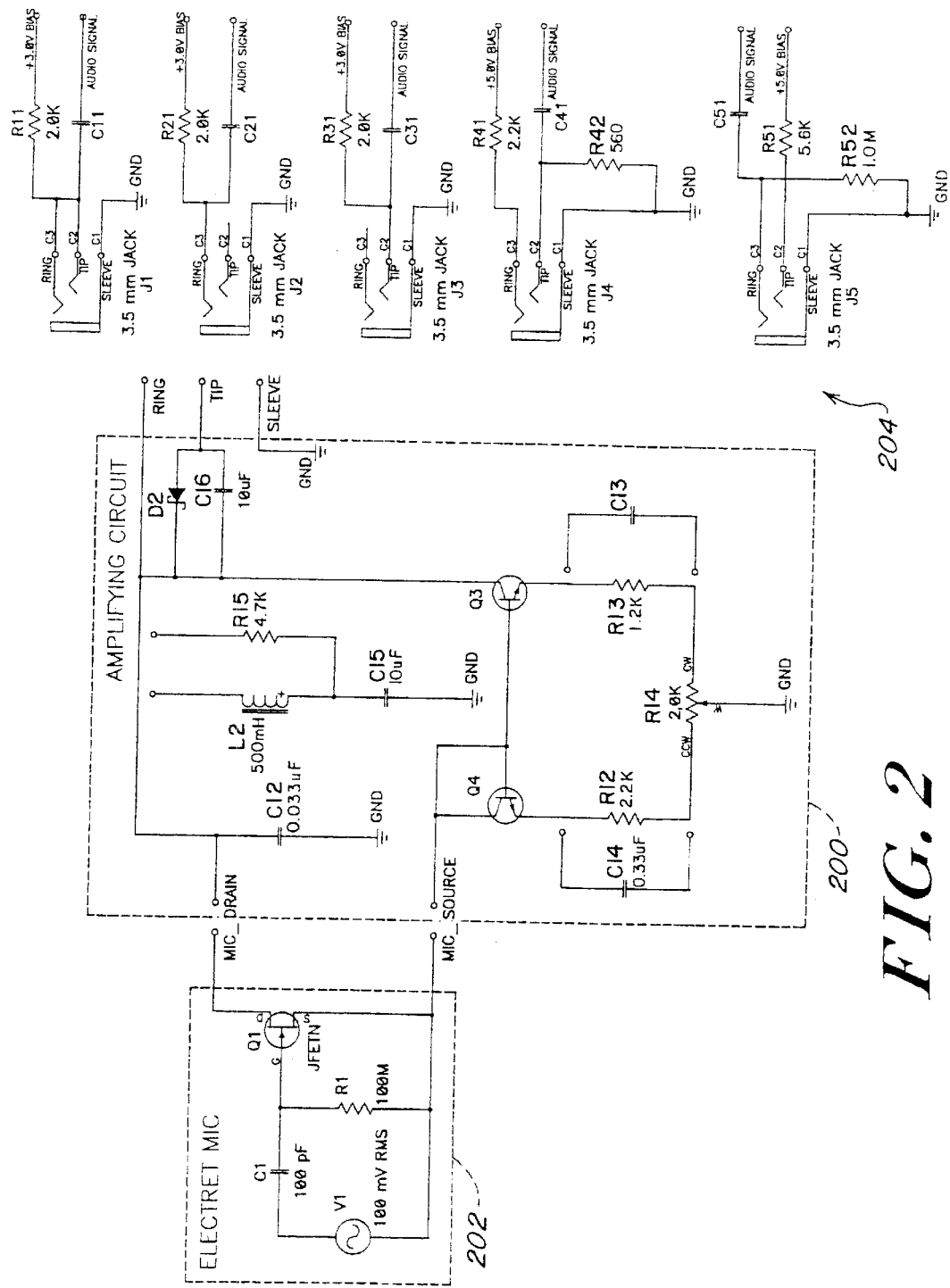
FIG. 2 is a schematic circuit diagram of an exemplary arrangement of an amplifier circuit with a current mirror sink circuit, an electret mic and associated output jack connections in accordance with the invention.

The circuit 100 can enhance the speech recognition performance of low cost electret mics for many combinations of tip and ring wiring of signal and bias at the sound card. An alternative embodiment of the invention will now be described that further increases dynamic range. FIG. 2 is a schematic circuit diagram of an exemplary arrangement of an amplifier circuit 200 with a current mirror sink circuit, an electret mic 202 and associated sound card jack connections 204. FIG.2 depicts an NPN current mirror sink transistor pair Q3, Q4 such that mic current through diode connected Q4 is reproduced in the Q3 leg, multiplied by the ratio of their emitter resistors R12 and R13. This follows from the fact that the bases are tied together, and therefore the voltage from each emitter to ground is equal. Thus, with 150 $\mu$A mic current and resistor R14 at mid value, the collector of Q3 will sink a current I=150(R12+R14/2)/(R13+R14/2)=205 $\mu$A, and total current will be 355 $\mu$A.

With a lower current mic such as 80 $\mu$A, resistor R14 can be adjusted for maximum I such that total current becomes 346 $\mu$A. For a different, higher mic current, say 220 $\mu$A, adjusting R14 for minimum I results in 357 $\mu$A total current. Thus, one DC adjustment will accommodate a wide range of mic currents and result in a nearly constant 350 $\mu$A sum at the output of the amplifier circuit 200. Constant current operation, despite the inevitable mic to mic DC variation, assures consistent speech recognition performance with a given sound card. When connected to the exemplary output connection J1, the mic drain DC level is 3.0V−2.0 k$\Omega$×350 $\mu$A=2.3V. Using again the typical 150 $\mu$A current mic and R14 at mid setting, the voltage from mic source to ground is 0.6V+(2.2 k$\Omega$+1.0 k$\Omega$)150 $\mu$A=1.1V. With the drain at 2.3V and the source at 1.1V, the output can swing from about one volt to almost three volts before clipping.

The increased dynamic range of the circuit 200 of FIG. 2 over circuit 100 of FIG. 1 is advantageous and results from the total current in circuit 200 being variable signal current. In the embodiment of FIG. 1, only 200 $\mu$A of the 350 $\mu$A total current is variable, the remaining 150 $\mu$A is rendered constant by the averaging action of inductor L1 and capacitor C2. Transistors Q3 and Q4 may be part of a monolithic IC structure for better matching, however, this is not mandatory and discrete devices such as 2N5088 or 2N5089 may be used. Any $V_{BE}$ mismatch between a discrete Q3 and Q4 will amount to a few millivolts and will be masked by their emitter resistor drops of a few hundred millivolts.

As before, it is beneficial to band pass and avoid unwanted mic sensitivity at low and high frequencies. Capacitor C12 will provide a low pass −3 dB corner frequency of 2.4 kHz when connected to connector J1 and hence to resistor R11. The network of inductor L2, resistor R15, and capacitor C15, when optionally connected to the drain as shown in FIG. 2, will result in a high pass −3 dB point at 251 Hz, determined primarily by the L2 inductance and winding a resistance of approximately 80 $\Omega$. It should be noted that low Q, low cost inductors that are not suitable for other audio filter applications because of the lossy winding are entirely appropriate in both the FIG. 1 and FIG. 2 embodiments. The resistor R15 (FIG. 2) may be connected in parallel with inductor L2 to alter the slope of the mic sensitivity versus frequency curve, in fact it is often necessary to tailor this response using acoustic measurements starting with values derived from circuit analysis.

A different option for obtaining a high pass characteristic without the use of inductors is to connect a capacitor across the emitter resistor of Q4. This will cause the AC component of emitter current to be lower at very low frequencies (because less signal current will be mirrored from Q3 to Q4) and will result in a −3 dB corner frequency of 239 Hz when capacitor C2 is 0.33 $\mu$F and resistor R12 is 2.2 k$\Omega$. The overall response may be shaped further by an additional capacitor C13 in parallel with resistor R13 during acoustic testing. Whether an inductor is used or not, the output impedance of the amplifier circuit may again be lowered with resistive loading at resistor R15 in FIG. 2 as was previously shown with reference to resistor R6 in FIG. 1. If resistor R15 is made variable, it may also be used to set the mic output at a particular level without disturbing DC conditions and hence the dynamic range or swing. A current gain of 350/150 or 7.4 dB relative to the same mic element without a circuit leaves room for some attenuation and the accommodation of a wider mic sensitivity tolerance; for instance R15//R11=4.7 k$\Omega$//2.0 k$\Omega$ yields 2.9 dB lower output. Low cost mics with a +/−4 dB tolerance may thus be adjusted to the +/−1.5 dB sensitivity spread of higher cost electrets.

Figure 3:
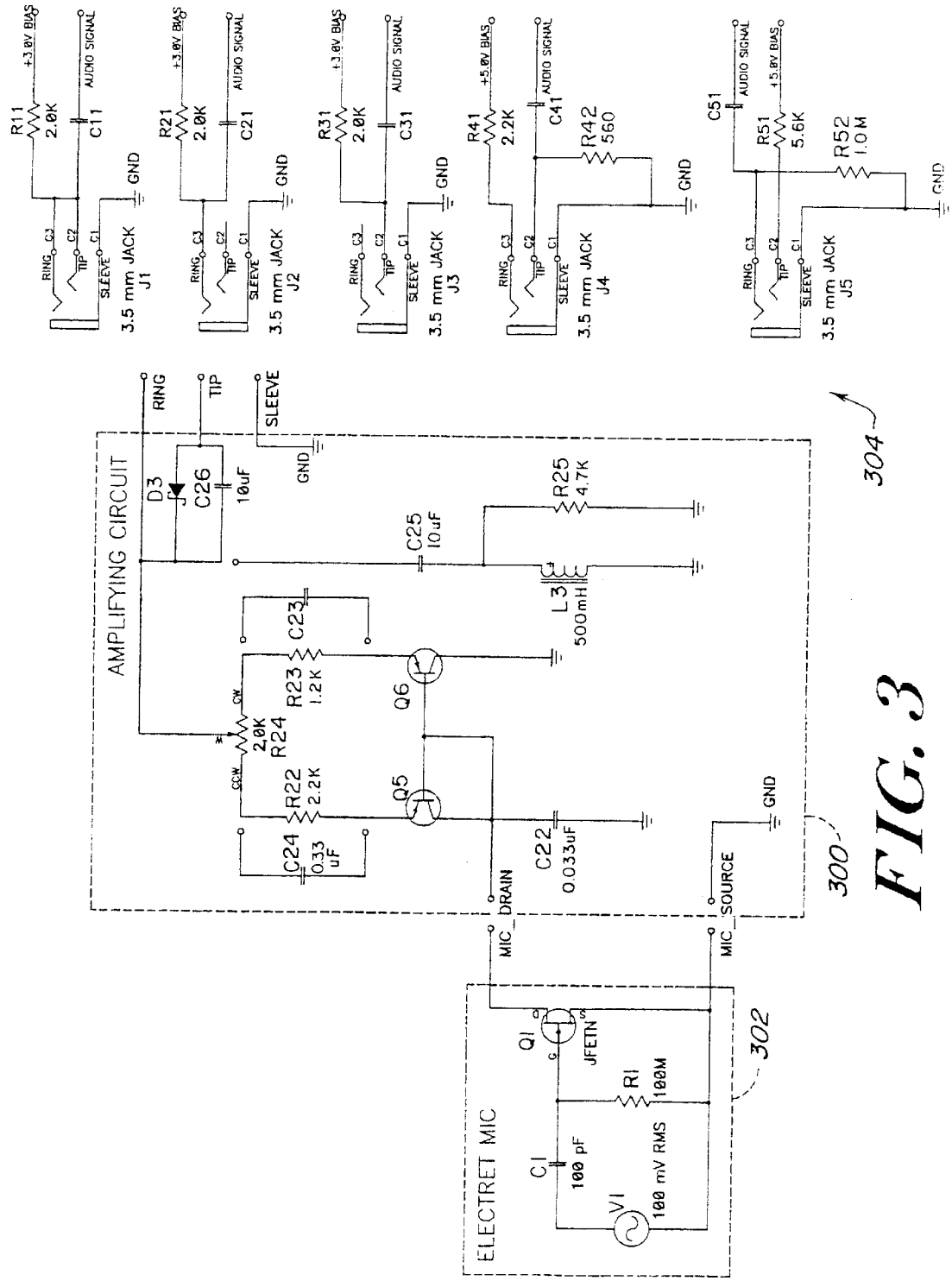
FIG. 3 is a schematic circuit diagram of an exemplary arrangement of an amplifier circuit with a current mirror source circuit, an electret mic and associated output jack connections in accordance with the invention.

Another embodiment of the present invention is the dual of the NPN amplifier circuit of FIG. 2 using PNP transistors instead. FIG. 3 is a schematic circuit diagram of an exemplary arrangement of an amplifier circuit 300 with a current mirror source circuit, an electret mic 302 and associated output jack connections 304 in accordance with the invention. The configuration of FIG. 3 has the advantage of grounding at the mic source and using a simpler cable when shielding is required. In other words, the arrangement of FIG. 2 requires two conductors plus a shield between circuit and mic, while the arrangement of FIG. 3 operates with one conductor plus a shield. With reference to FIG. 3, PNP transistors Q5 and Q6 form a current mirror source such that the mic current through Q5 is repeated at Q6, but multiplied by the emitter resistor ratios as before. Exemplary transistors for this circuit are 2N5086 or 2N5087. All performance parameters of FIG. 2 such as dynamic range and frequency shaping apply to FIG. 3 with identical results.

Figure 4:
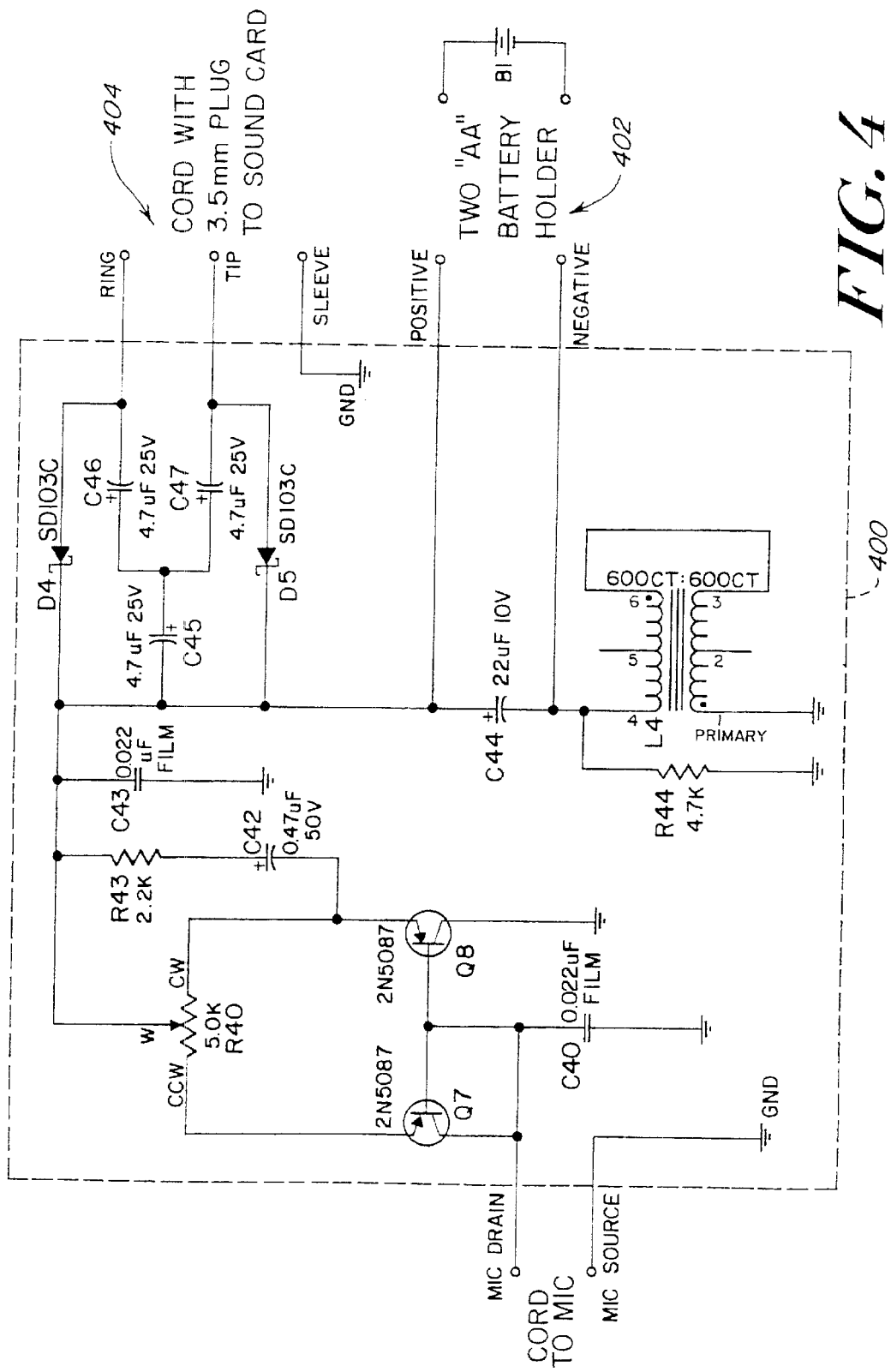
FIG. 4 is a schematic circuit diagram of an exemplary current mirror source circuit, battery connection and output coupling network in accordance with the invention.

Another alternative embodiment of the invention is shown in FIG. 4. FIG. 4 is a schematic circuit diagram of an exemplary current mirror source amplifier circuit 400, battery connection 402 and output coupling network 404 in accordance with the invention. Two additional improvements can be observed: battery terminals and greater output wiring diversity. The following discussion will focus on the improvements.

Transistors Q7 and Q8 form a PNP current mirror with a potentiometer R40 setting the current ratio. At the mid point of R40, the ratio is 1:1 and for an exemplary 150 $\mu$A electret mic, total current is 300 $\mu$A. Additional fixed resistors between the end terminals of R40 and the emitters of Q7 and Q8 are avoided in this instance in order to maximize DC adjustment range, particularly for higher current electret mics, where R40 would be adjusted with wiper W at CCW. The resulting high resistance in series with the Q7 emitter can now be AC shunted for the audio frequencies of interest by the series combination of a capacitor C42 and resistor R43 for higher gain with no DC burden. Selecting 0.47 $\mu$F for C2 and 2.2 k$\Omega$ for R42 provides AC gain at frequencies above 154 Hz.

Capacitors C40 and C43 provide two high frequency attenuation poles and the values are selected during acoustic frequency sweeps of the electret microphone and the circuit of the invention as detailed below. The electrical, contribution of each RC pole is −6 dB per octave above the corner frequency. Voice is commonly digitized by PC sound cards with a resolution of 16 bits at a sampling rate of 11.025 kilobits per second. Only frequencies below the Nyquist criterion of 5.5 kHz can contribute information and common electret mics have rising or "ski slope" sensitivities above 1 kHz, so once a mic element is chosen, values for C40 and C43 are selected for a slight dip in sensitivity above 2 kHz towards a more significant drop at 6 kHz.

The contribution of FIG. 4 components L4, R44 and C44 in setting output level and attenuating frequencies below 251 Hz has been described with reference to the FIG. 2 network of L2, R15 and C15. Inductor L4 is now shown as a common 600:600$\Omega$ center-tapped telephony transformer wired in series for maximum inductance. Terminals 5, 6 or 2 are available for further frequency shaping with resistors to ground. Capacitor C44 is essentially a DC block or AC short between the amplifier circuit 400 output and L4//R44. The configuration of FIG. 4 presents an opportunity for a parallel connection of batteries if required or desired. The low battery impedance does not shunt the audio output because it is in series with high impedance pair L4//R44, while the low winding resistance of L4 advantageously completes a DC path for the batteries from the amplifier circuit to ground.

It will now be described that a suitable output coupling network can maintain circuit operation with or without batteries with all sound card input wiring variations. In the absence of batteries, diode D4 will admit bias current if it is presented on the ring terminal by the sound card and D5 will admit current from the tip. Diodes D4 and D5 will also conduct mic bias current from the sound card mic jack if tip and ring are tied together as in connection J1 of FIG. 3, or even if each of the tip and ring terminals are independently connected with resistors to a DC bias voltage source. The audio signal from the amplifier circuit is presented to both output terminals tip and ring equally and symmetrically by "Y" connected 4.7 $\mu$F capacitors C45, C46, C47. The 4.7 $\mu$F value represents a short at frequencies of interest.

In the simplest case, each one of diodes D4 and D5 could be paralleled with a non-polar electrolytic capacitor for coupling AC signal in the absence of DC current (consequently low impedance) through the diode. Such a non-polar capacitor is expensive and is sometimes replaced with two common polarized electrolytics connected in series with like polarities at the common node. The total cost of four polarized capacitors in place of two non-polar units is lower. Since in the present instance the D4, D5 anodes are tied together, it is possible to complete the signal coupling function with three polarized electrolytic capacitors at even lower cost by connecting like (+) polarities together to form the "Y", connection of C45, C46, C47 in FIG. 4.

It will be appreciated by virtue of its symmetry that the output coupling network comprising D4, D5, C45, C46, C47 (FIG. 4) will accept DC bias and provide audio output to sound cards such as the exemplary connection J1 to J5 (FIG. 1), as well as every other combination of bias resistors, terminating resistors and coupling capacitors on the tip and ring terminals. The inevitable reduction of DC levels and signal attenuation when a mic is connected directly to the sound card is thus avoided without resorting to external adaptors and extra installation steps.

Batteries are optional and may only be needed when the voltage or current from the sound card is inadequately low. With such inadequate bias, the user of speech software will experience reduced recognition performance and be prompted to add batteries to the circuit of the invention to overcome the bias shortfall. If batteries were to be added when not needed, there is no harm and there may be some additional signal to noise improvement due to the filtering effect by the batteries on digital noise at the sound card input. Battery life will generally be extended because the contribution of DC from the sound card will reduce battery current. Schottky diodes are preferred because their low voltage drop (0.2V compared with 0.6V for Si diodes) minimizes loss of voltage from the sound card. This is vital since many more sound card input circuits exist than those shown as J1 to J5 in FIG. 1, and several are voltage and/or current limited by inappropriate choice of component values.

Clearly D4 and D5 will block any current from the batteries flowing into the sound card where it is not needed. The winding resistance of L4 (typically 80 Ω) drops very little battery voltage (24 mV at 300 μA), thus extending battery life down to voltages that would be unusable if presented by the sound card through its internal high bias resistance. Two "AA" batteries in series (3.0V total voltage) are typically used. Battery life will be approximately one year of continuous operation absent any DC contribution from the sound card. Longer life an be obtained by adjusting total current to a lower value such as 220 μA. This trade-off will reduce the possible need for batteries to a shorter list of sound cards with inadequate mic bias but will also lower dynamic range or "headroom" about 26%.

Equivalent circuit topologies that can achieve substantially the same results include more complex current mirrors, FETs instead of bipolar transistors and ICs instead of discrete devices. For example, Q2 and adjacent bias components in FIG. 1 can be replaced by an inverting op amp with a gain of 2 and a dummy load output resistance to sink about 250 μA. Supply current for an exemplary Texas Instruments TLC25M2C op amp is obtained from the voltage source node of L1 and C2. Output impedance will be advantageously low for driving inputs such as J4 and this may justify the cost of the operational amplifier IC.

Figure 5:
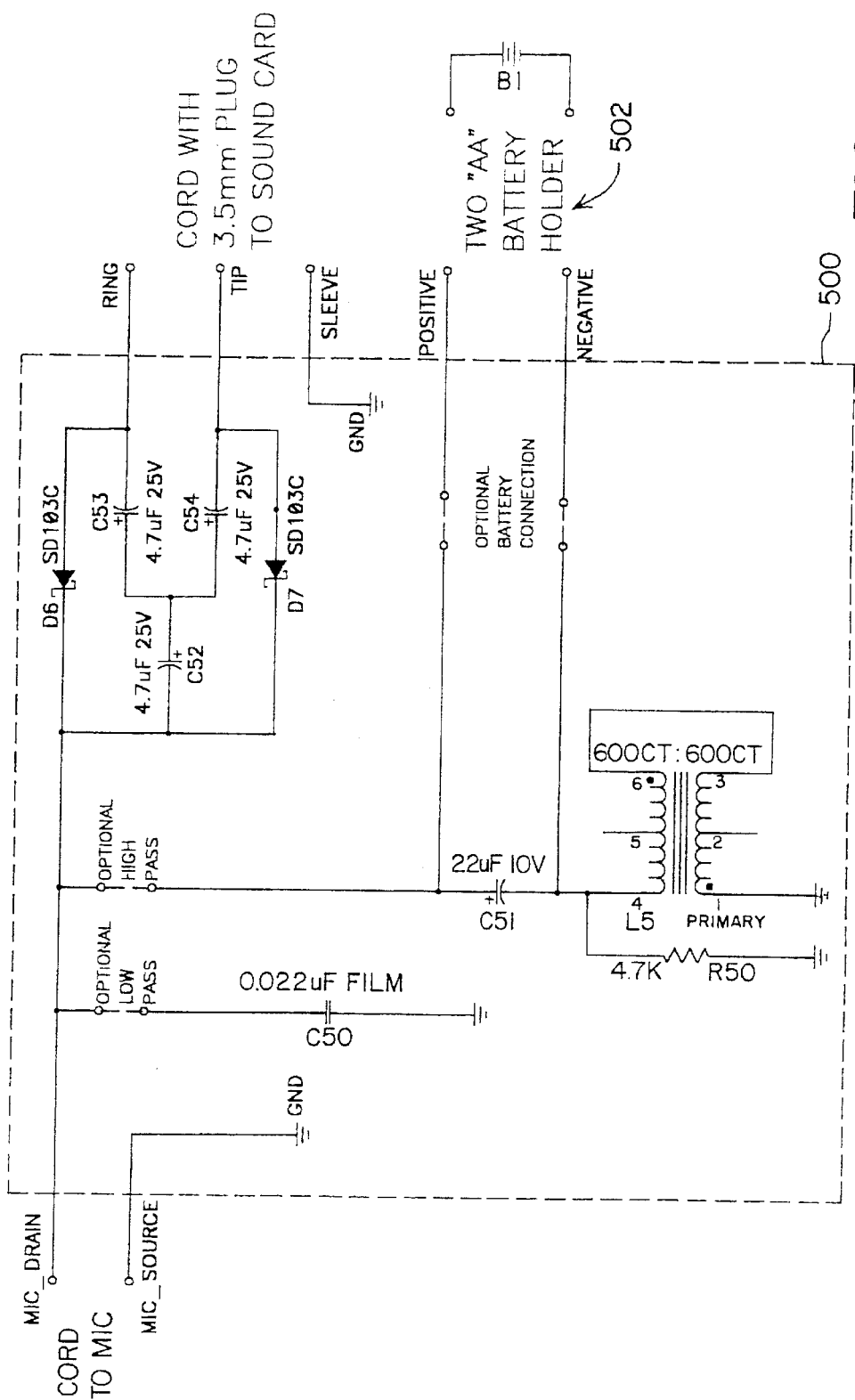
FIG. 5 is a schematic circuit diagram of an exemplary low pass circuit, optional battery connection and output coupling network in accordance with the invention.

The embodiment depicted in FIG. 5 is a subset of the circuitry of FIG. 4. It relies on all the FIG. 4 circuit components except those comprising the current mirror. Thus, circuit 500 may be preferred in cost sensitive applications which can still benefit from all of the improvements disclosed other than the extension of dynamic range or signal swing. For example, if DC bias is deemed adequate in certain applications, battery holder 502 may be omitted. A benefit of this omission is that a smaller circuit housing can accommodate the remaining components. Further size and cost reductions may be achieved in cases where the optional high pass components L5, R50, C51 are deleted. This may well be acceptable when a better microphone with an inherent high pass response is employed. An exemplary electret is Gentex Model 3065 with a high pass corner frequency at approximately 150 Hz. Even with low cost electrets, it is feasible to achieve some measure of rejection of frequencies below the voice band using a large foam microphone cover. Low pass capacitor C50 performs the function disclosed with reference to C43 of FIG. 4, and again may be deleted in cost sensitive applications or in instances where the mic housing rejects high frequencies acoustically. It will be appreciated that the remaining components comprising the coupling network D6, D7, C52, C53, C54 will optimally admit DC bias from the computer and return audio to the computer as described with reference to D4, D5, C45, C46, C47 of FIG. 4. Once more, compatibility with all possible sound card input wiring variations is achieved without reliance on external converter plugs or special adapters. When such abbreviated circuitry is utilized, a separate housing on the headset cord may be avoided. Instead, the components may be placed on the headset as part of the earcup or mic boom.

Although the present invention has been shown and described with respect to several preferred embodiments thereof, various changes, omissions and additions to the form and detail thereof, may be made therein, without departing from the spirit and scope of the invention.

What is claimed is:

1. A circuit for connecting an electret microphone to one of a plurality of audio inputs, each audio input being a combination of bias resistors, terminating resistors and coupling capacitors, comprising:

a self-configuring coupling circuit, including one diode and one capacitor, for accepting DC bias voltage from said audio inputs and for providing an audio output signal to be received, without reduction of DC levels and signal attenuation, by any one of the combinations of bias resistors, terminating resistors and coupling capacitors associated with the plurality of audio inputs; and frequency shaping circuitry for reducing unwanted microphone sensitivity at selected frequencies.

2. The circuit of claim 1, wherein said at least one diode is a Schottky diode.

3. The circuit of claim 1 further comprising:

low frequency shaping means for reducing unwanted microphone sensitivity at low frequencies; and high frequency shaping means for reducing unwanted microphone sensitivity at high frequencies.

4. The circuit of claim 3, wherein said low frequency shaping means comprises RC components disposed to attenuate frequencies below approximately 200 Hz.

5. The circuit of claim 3, wherein said low frequency shaping means comprises RLC components disposed to attenuate frequencies below approximately 200 Hz.

6. The circuit of claim 3, wherein said low frequency shaping means comprises a capacitor, a tapped inductor and at least two resistors connected to provide fine control of high pass frequency slope.

7. The circuit of claim 3, wherein said high frequency shaping means comprises at least one capacitor and attenuates frequencies above approximately 2 kHz.

8. The circuit of claim 3, wherein said low frequency shaping means and said high frequency shaping means are combined for providing a bandpass characteristic with substantially flat frequency response between approximately 300 Hz and 2 kHz.

9. The circuit of claim 3, wherein said low frequency shaping means and said high frequency shaping means are resistively scaled to present lower output impedance to said audio input.

10. A circuit for connecting an electret microphone to audio inputs comprising:

a coupling circuit for accepting DC bias voltage from said audio inputs and providing audio signal to said inputs;

frequency shaping circuitry for reducing unwanted microphone sensitvity at selected frequencies; and a battery connector where at least one battery is connected, wherein said battery connector is connected in parallel with a capacitor C and in series with an inductor L of RLC components such that said inductor high reactance and low resistance will sustain circuit operation at reduced voltage from said at least one battery.

11. The circuit of claim 10, wherein said battery connector prevents adverse circuit operation if said at least one battery is added when not needed.

* * * * *